United States Patent
Tucker et al.

(10) Patent No.: US 10,077,497 B2
(45) Date of Patent: Sep. 18, 2018

(54) HOLLOW CATHODE DISCHARGE (HCD) SUPPRESSING CAPACITIVELY COUPLED PLASMA ELECTRODE AND GAS DISTRIBUTION FACEPLATE

(71) Applicant: Lam Research Corporation, Freement, CA (US)

(72) Inventors: Jeremy Tucker, Portland, OR (US); Edward Augustyniak, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 433 days.

(21) Appl. No.: 14/700,749

(22) Filed: Apr. 30, 2015

(65) Prior Publication Data

US 2015/0345020 A1 Dec. 3, 2015

Related U.S. Application Data

(60) Provisional application No. 62/005,454, filed on May 30, 2014.

(51) Int. Cl.
 C23C 16/455 (2006.01)
 C23C 16/50 (2006.01)
 (Continued)

(52) U.S. Cl.
 CPC .......... *C23C 16/50* (2013.01); *C23C 16/4412* (2013.01); *C23C 16/45563* (2013.01);
 (Continued)

(58) Field of Classification Search
 CPC ............... C23C 16/50; C23C 16/4412; C23C 16/45563; H01J 37/32513; H01J 37/32568; H01J 37/32449
 (Continued)

(56) References Cited

U.S. PATENT DOCUMENTS 5,605,637 A * 2/1997 Shan ................. H01J 37/32477
 118/723 E
7,972,467 B2 7/2011 Bera et al.
(Continued)

FOREIGN PATENT DOCUMENTS

| CN | 1538503 A | 10/2004 |
|----|-----------|---------|
| CN | 101441983 A | 5/2009 |
| CN | 101960568 A | 1/2011 |

OTHER PUBLICATIONS

First Office Action for Chinese Application No. 201510290218.X dated Nov. 30, 2016; 6 pages.

*Primary Examiner* — Rudy Zervigon

(57) ABSTRACT

A faceplate for a gas distribution system of a plasma processing chamber includes a faceplate body having a first surface, a second surface opposite to the first surface and a side surface. A first plurality of holes in the faceplate body extends from the first surface to the second surface. At least some of the first plurality of holes has a first size dimension and a second size dimension in a plane parallel to the first surface. The first size dimension is transverse to the second size dimension. The first size dimension is less than 3 plasma sheath thicknesses of plasma generated by the plasma processing chamber. The second size dimension is greater than 2 times the first size dimension.

31 Claims, 7 Drawing Sheets

(51) Int. Cl.
 *C23C 16/44* (2006.01)
 *H01J 37/32* (2006.01)
(52) U.S. Cl.
 CPC .. *H01J 37/32449* (2013.01); *H01J 37/32513* (2013.01); *H01J 37/32568* (2013.01)
(58) Field of Classification Search
 USPC ........ 118/723 R, 723 E; 156/345.33, 345.34, 156/345.43
 See application file for complete search history.

(56) References Cited

U.S. PATENT DOCUMENTS

| | | | |
|---|---|---|---|
| 8,075,728 | B2 | 12/2011 | Balakrishna et al. |
| 9,175,393 | B1 * | 11/2015 | Higashi .................... C23C 16/50 |
| 2006/0236931 | A1 * | 10/2006 | Singh ....................... C23C 14/48 |
| | | | 118/723 E |
| 2009/0173389 | A1 | 7/2009 | Fischer |
| 2009/0236041 | A1 * | 9/2009 | Iizuka ................. C23C 16/4412 |
| | | | 156/345.34 |
| 2014/0209027 | A1 * | 7/2014 | Lubomirsky ........... B05B 1/005 |
| | | | 118/724 |

* cited by examiner

HOLLOW CATHODE DISCHARGE (HCD) SUPPRESSING CAPACITIVELY COUPLED PLASMA ELECTRODE AND GAS DISTRIBUTION FACEPLATE

CROSS-REFERENCE TO RELATED APPLICATIONS

This application claims the benefit of U.S. Provisional Application No. 62/005,454, filed on May 30, 2014. The entire disclosure of the application referenced above is incorporated herein by reference.

FIELD

The present disclosure relates to substrate processing systems, and more particularly to substrate processing systems using capacitively coupled plasma.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform deposition and/or etching of film on a substrate such as a semiconductor wafer. Substrate processing systems typically include a processing chamber with a substrate support such as a pedestal, an electrostatic chuck, a plate, etc. A substrate such as a semiconductor wafer may be arranged on the substrate support. In chemical vapor deposition (CVD), plasma enhanced CVD (PECVD), atomic layer deposition (ALD) or PEALD processes, a gas mixture including one or more precursors may be introduced into the processing chamber to deposit or etch a film on the substrate.

Some processes use a gas distribution device such as a showerhead. The gas distribution device may include a faceplate with a plurality of circular holes. The circular holes are arranged in a pattern to provide a desired gas flow. Process gases are supplied to a cavity defined in the gas distribution device and is disbursed by the circular holes of the faceplate over the substrate.

In PECVD and PEALD, radio frequency (RF) plasma may be used to activate chemical reactions. For example, a capacitively coupled plasma (CCP) generator may be used to generate plasma in the processing chamber. The plasma may be struck in a space between the faceplate of the gas distribution device and the pedestal. The faceplate of the gas distribution device may act as one electrode of the CCP generator.

When plasma is used during substrate processing, some parasitic plasma may also be generated in the processing chamber. For example only, hollow cathode discharge (HCD) is one form of parasitic plasma that may occur in the circular holes of the faceplate of the gas distribution device. HCD may be detrimental to hardware (specifically, the electrode) because HCD dissipates significant power within a small volume.

SUMMARY

A faceplate for a gas distribution system of a plasma processing chamber includes a faceplate body having a first surface, a second surface opposite to the first surface and a side surface. A first plurality of holes in the faceplate body extends from the first surface to the second surface. At least some of the first plurality of holes has a first size dimension and a second size dimension in a plane parallel to the first surface. The first size dimension is transverse to the second size dimension. The first size dimension is less than 3 plasma sheath thicknesses of plasma generated by the plasma processing chamber. The second size dimension is greater than 2 times the first size dimension.

In other features, the first size dimension is less than 2 plasma sheath thicknesses of plasma generated by the plasma processing chamber. The second size dimension is greater than 9 times the first size dimension. The faceplate body includes a second plurality of holes arranged radially outside of the first plurality of holes. At least some of the second plurality of holes has the first size dimension and the second size dimension. At least some of the second plurality of holes are circular-shaped and have a diameter that is less than 3 plasma sheath thicknesses of the plasma.

In other features, at least some of the first plurality of holes are circular-shaped and have a diameter that is less than 3 plasma sheath thicknesses of the plasma.

A plasma processing system to process a substrate includes a processing chamber. A gas distribution device is arranged in the processing chamber and includes an upper portion, a faceplate and a first cavity between the upper portion and the faceplate. A substrate support is arranged in the processing chamber to support the substrate. A plasma generator generates plasma between the faceplate and the substrate support. The faceplate includes a faceplate body having a first surface, a second surface opposite to the first surface and a side surface, and a first plurality of holes in the faceplate body that extend from the first surface to the second surface. At least some of the first plurality of holes are slot-shaped and have a first size dimension and a second size dimension in a plane parallel to the first surface. The first size dimension is transverse to the second size dimension. The first size dimension is less than 3 plasma sheath thicknesses of the plasma generated by the plasma generator. The second size dimension is greater than 2 times the first size dimension.

In other features, the first size dimension is less than 2 plasma sheath thicknesses of plasma generated by the plasma processing chamber. The second size dimension is greater than 9 times the first size dimension. The faceplate body includes a second plurality of holes arranged radially outside of the first plurality of holes. At least some of the second plurality of holes are slot-shaped and have the first size dimension and the second size dimension. At least some of the second plurality of holes are circular-shaped and have a diameter that is less than 3 plasma sheath thicknesses of the plasma generated by the plasma generator. At least some of the first plurality of holes are circular-shaped and have a diameter that is less than 3 plasma sheath thicknesses of the plasma generated by the plasma generator.

In other features, first, second and third annular metal seals are arranged in the first cavity to define a supply portion, an exhaust portion and a gas curtain portion of the first cavity. Process gas flows through a second cavity in the upper portion, through the faceplate and into the supply portion of the first cavity. The substrate is exposed to the process gas and then the process gas flows back through the faceplate, the exhaust portion of the first cavity, and the upper portion. Purge gas flows through the upper portion to the gas curtain portion of the first cavity.

A method for reducing hollow cathode discharge in a faceplate of a gas distribution device used in a plasma process includes determining a plasma sheath thickness for the plasma process; providing a faceplate including a faceplate body having a first surface, a second surface opposite to the first surface and a side surface; and creating a first plurality of holes in the faceplate body that extend from the first surface to the second surface. At least some of the first plurality of holes have a first size dimension and a second size dimension in a plane parallel to the first surface. The first size dimension is transverse to the second size dimension. The first size dimension is less than 3 plasma sheath thicknesses of plasma generated by the plasma process. The second size dimension is greater than 2 times the first size dimension. The method includes arranging the faceplate adjacent to an upper portion of a gas distribution device of a plasma processing chamber; and striking plasma and flowing process gases through the faceplate of the gas distribution device to expose a substrate to the process gases.

In other features, the plasma sheath thickness is determined based on plasma density, electron temperature, and applied plasma driving voltage. The method includes creating a second plurality of holes in the faceplate body radially outside of the first plurality of holes.

In other features, at least some of the second plurality of holes have the first size dimension and the second size dimension. At least some of the second plurality of holes are circular-shaped and have a diameter that is less than 3 plasma sheath thicknesses of the plasma. At least some of the first plurality of holes are circular-shaped and have a diameter that is less than 3 plasma sheath thicknesses of the plasma.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

HCD may be prevented by either increasing or decreasing the diameter of the circular holes (which become hollow cathodes) in the faceplate of the gas distribution device. For some process conditions, the circular hole size that is required to prevent HCD is large enough that gas distribution across the substrate may become non-uniform. Additionally, using fewer circular holes with larger diameters may cause jetting, which can adversely impact film uniformity. If the hole diameter is reduced below the threshold for HCD, the number of circular holes that is required to maintain gas flow increases significantly because conduction is a function of hole diameter to the 4th power. Furthermore, machining a large number of holes is typically costly and time consuming.

Figure 1A:
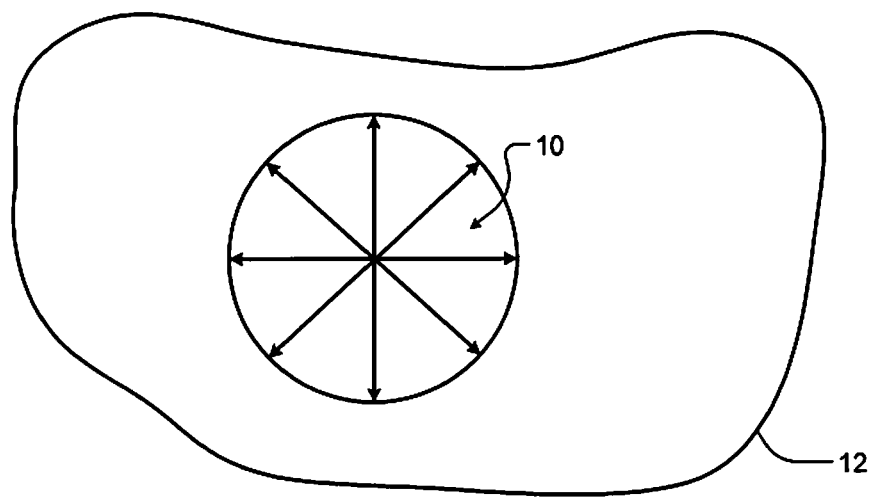
FIGS. 1A and 1B illustrate the hollow cathode effect in first and second holes of example faceplates of a gas distribution device.
Figure 1B:
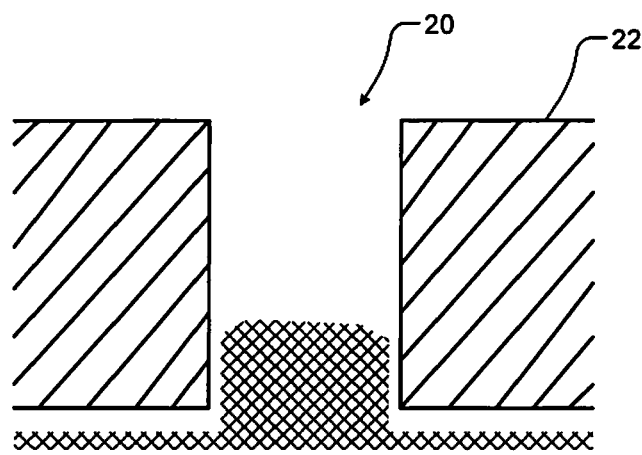

The geometry of at least some of the holes in the faceplate can be altered according to the present disclosure to reduce or eliminate the hollow cathode effect. In FIG. 1A, decreasing the diameter of a hole 10 in a faceplate 12 eliminates the hollow cathode effect by moving the cathode walls closer together such that plasma is not able to enter the cavity. Without plasma in the cavity, the hollow cathode effect cannot develop. Alternately in FIG. 1B, the hollow cathode effect can also be eliminated by moving walls of a hole 20 in a faceplate 22 far enough apart such that the electrons do not have enough energy to oscillate back and forth across the greater distance.

The plasma effect inside a cathode cavity depends on the size of the cathode cavity relative to a plasma boundary layer, which is called the plasma sheath. Plasma sheath thickness depends on plasma density, electron temperature, and applied driving voltage. For example only, CCP plasma sheath thickness typically varies from a fraction of 1 mm to a few millimeters.

Plasma sheath acts as a potential barrier for the bulk plasma electrons. Electrons are repelled when they try to enter sheaths. The repulsion accelerates electrons back into bulk plasma. If two repulsive sheaths face each other in close proximity, electrons may start oscillations between them. Such oscillations of electrons trapped in the potential well may lead to increased ionization rates through collisions with background gas and give origin to the hollow cathode effect.

Since plasma develops the sheath at surrounding surfaces, the plasma can only enter cavities that are large enough to accommodate bulk plasma and sheaths on both sides. Cavities such as holes with an opening that is equal to 2 to 3 plasma sheath widths is often considered to be the limiting case. When the circular holes in the faceplate are smaller than 2 to 3 plasma sheath thicknesses, plasma cannot form inside the holes. As a result, HCD cannot be triggered in the smaller circular holes. If, on the other hand, the circular holes in the faceplate are larger than 2 to 3 plasma sheath thicknesses, plasma can enter the holes.

If the hole size is just slightly larger than 2 to 3 plasma sheath thicknesses, bulk plasma is thin and the two opposite sheaths can interact by bouncing off electrons. Electron oscillations lead to an increased ionization rate and denser plasma. Such localized dense plasma or HCD is maintained mainly by energetic electrons oscillating between opposite facing sheaths. If the hole size is significantly larger than 2 to 3 plasma sheath thicknesses, bulk plasma can enter the larger cavity without any problem. No discharge enhancement occurs because sheaths are far enough apart. Electrons accelerated by the sheath on one side of the larger hole cannot reach the other sheath because of collisions with the background gas. No oscillatory motion is possible and no extra ionization happens. Therefore, HCD is not triggered.

The present disclosure solves the problem of HCD by using holes in a gas distribution device that have a unique geometry. The particular geometry of the gas holes in the gas distribution device are selected for specific process conditions. For a given process condition, the minimum and maximum diameter required to sustain HCD can be estimated analytically or determined empirically. According to the present disclosure, the holes in the faceplate of the gas distribution device use a combined approach rather than (i) making the gas holes smaller than the minimum diameter that can sustain HCD, or (ii) larger than the maximum diameter that can sustain HCD.

The holes in the faceplate of the gas distribution device according to the present disclosure are slot-shaped and have a first size dimension (such as a width) that is less than the minimum size dimension that will sustain HCD and a second size dimension (such as a length) that is larger than the minimum size dimension that will sustain HCD. In other words, one of the size dimensions is used to prevent HCD and the other one of the size dimensions is increased to reduce the number of holes that would otherwise be needed if circular holes were used.

In some examples, the first size dimension of the slot is less than 2 or 3 plasma sheath thicknesses. In some examples, the second size dimension of the slot is greater than the first size dimension. In some examples, the second size dimension of the slot is 2-10 times greater than the first size dimension. For example only, the slots may have a first size dimension of 0.04 inches and a second size dimension of 0.4 inches.

In other words, the particular geometry disclosed herein allows adjustment of the first dimension to suppress HCD and adjustment of the second dimension to optimize flow conductance/uniformity. For example using one set of process conditions, the first dimension is 0.04" in order to suppress HCD, but 2500 circular holes having this diameter would be needed to provide the necessary flow conduction. By changing the geometry from a circular hole to a slot shape and increasing the second dimension to 0.4", the number of holes needed to provide the same flow conductance is reduced to 72.

The flow conduction through a circular hole can be roughly approximated by $$\frac{\pi}{256}d^4,$$

where d is a diameter of the circular hole. In contrast, the flow conduction of a narrow slot with laminar flow and the same thickness can be roughly approximated by $$\frac{1}{24}ab^3,$$

where a is the length and b is the width. If the second size dimension is 2 times the first size dimension, the conductance will be about 2.4 times that of two holes with diameters of the first dimension. As can be seen from the foregoing, doubling the second size dimension of one slot (relative to the circular hole) significantly improves the conductance relative to two circular holes with the same original width. Additional improvement can be seen with greater increases in the second size dimension relative to the first size dimension.

The geometry of at least some of the holes in the faceplate according to the present disclosure have a slotted shape such that the plasma sheath cannot enter due to the proximity of the opposing walls. The width and length of the slots may be determined based on the pressure, reactant species, and plasma power for a particular process to be used. In some examples, the slots are arranged with the length of slot aligned with radial lines of the faceplate. In other examples, the slots are arranged with the length of slots transverse to the radial lines or at other angles relative to the radial lines.

In order for a faceplate to produce a similar flow conduction as faceplates with the slotted-shaped holes and without HCD as described herein, the faceplate would require a very large number of circular holes (each with a diameter less than or equal to 2 or 3 plasma sheath thicknesses). The large number of holes typically requires costly machining, which is expensive. Because fewer slots are required to produce the same results as a larger number of circular holes, the faceplate is less expensive to manufacture and can also be made from a wider variety of materials.

Figure 2:
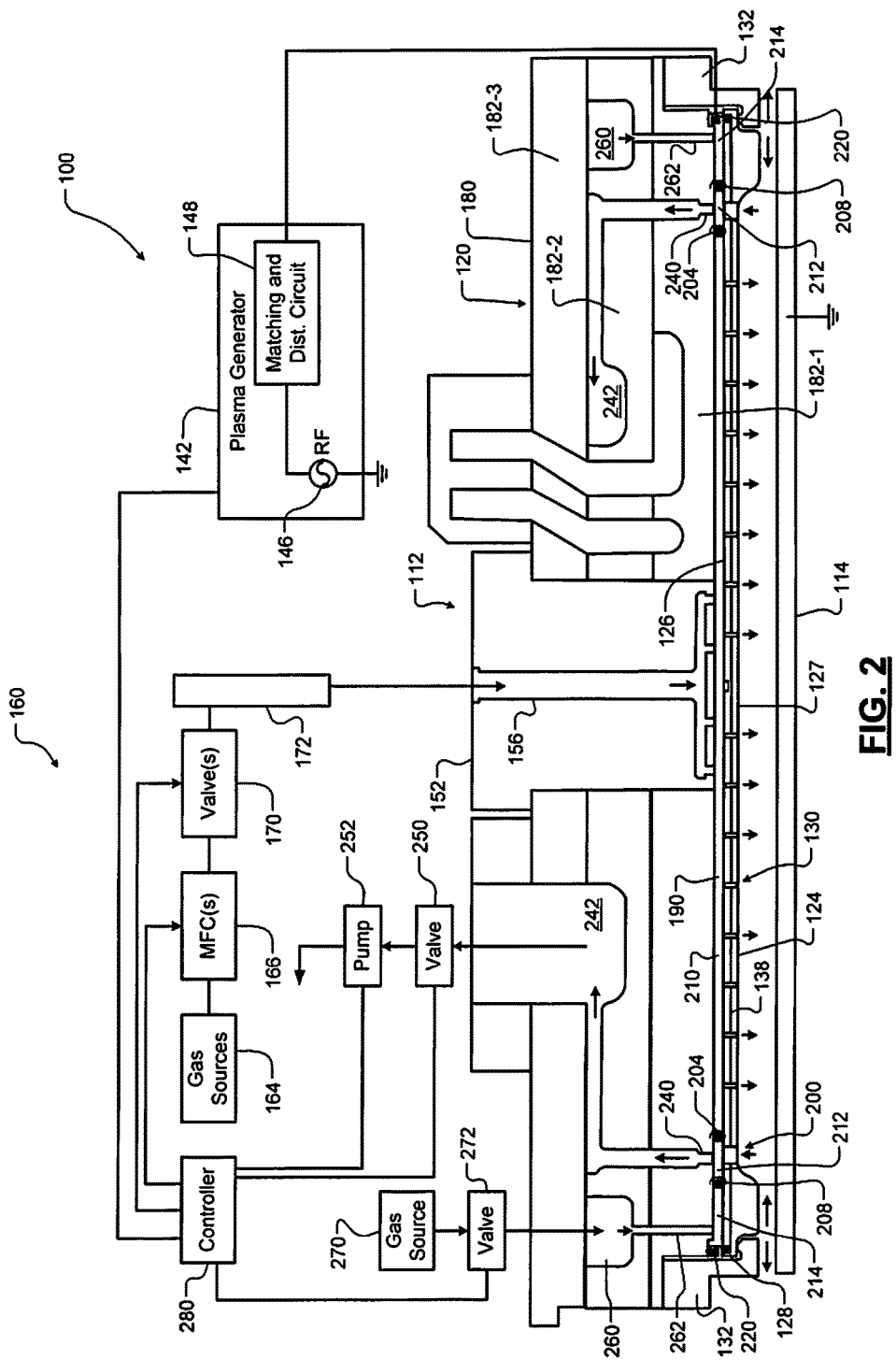
FIG. 2 illustrates a cross-sectional view of an example of a processing chamber including a faceplate according to the present disclosure.

Referring now to FIG. 2, an example of a processing chamber 100 is shown. The processing chamber 100 includes a gas distribution device 112 arranged adjacent to a substrate support 114. In some examples, the processing chamber 100 may be arranged inside of another processing chamber. A pedestal may be used to lift the substrate support 114 into position to create a micro process volume. The gas distribution device 112 includes a faceplate 124 and an upper portion 120 that includes various cavities that are used to deliver process gas and purge gas and/or to remove exhaust gas as will be described further below.

In some examples, the faceplate 124 is made of a conducting material such as aluminum. The faceplate 124 includes a faceplate body 125 having a first surface 126, a second surface 127 (that is opposite the first surface and that faces the substrate during use), a side surface 128 and the first plurality of holes 130 (extending from the first surface 126 to the second surface 127). The faceplate 124 may rest on an isolator 132. In some examples, the isolator 132 may be made of $Al_2O_3$ or another suitable material.

In other examples, the faceplate 124 is made of a non-conducting material such as ceramic. For example, aluminum nitride (AlN) may be used. If a non-conducting material is used, the faceplate 124 may include an embedded electrode 138. In some examples, the substrate support 114 is grounded or floating and the faceplate 124 is connected to a plasma generator 142. The plasma generator 142 includes an RF source 146 and a matching and distribution circuit 148.

In the example in FIG. 2, the upper portion 120 may include a center section 152 that defines a first cavity 156. In some examples, the center section 152 is made of $Al_2O_3$ or another suitable material. A gas delivery system 160 may be provided to supply one or more process gases, purge gases, etc. to the processing chamber 100. The gas delivery system 160 may include one or more gas sources 164 that are in fluid communication with corresponding mass flow controllers (MFCs) 166, valves 170 and a manifold 172. The manifold 172 is in fluid communication with the first cavity 156. The gas delivery system meters delivery of a gas mixture including one or more process gases to the manifold 172. The process gases may be mixed in the manifold 172 prior to delivery to the processing chamber 100.

The upper portion 120 also includes a radially outer section 180 arranged around the center section 152. The radially outer section 180 may include one or more layers 182-1, 182-2, . . . , and 182-N (collectively layers 182), where N is an integer greater than zero. In the example in FIG. 2, the radially outer section 180 includes N=3 layers 182 that define exhaust and gas curtain cavities, although additional or fewer layers may be used.

The center section 152 and the radially outer section 180 are arranged in a spaced relationship relative to the faceplate 124 to define a second cavity 190. The faceplate 124 may rest on an isolator 132. In some examples, the isolator 132 may be made of $Al_2O_3$ or another suitable material.

Process gas flows from the gas delivery system 160 through the first cavity 156 to the second cavity 190. The process gases in the second cavity 190 flows through the first plurality of holes 130 in the faceplate 124 to distribute the process gas uniformly across the substrate arranged on the substrate support 114. In some examples, the substrate support 114 is heated.

In some examples, the faceplate 124 may include a second plurality of holes 200 to provide an exhaust path for the process gas flow back through the faceplate 124 after the process gas is exposed to the substrate. The second plurality of holes 200 may be arranged around an outer periphery of the faceplate 124. In some examples, the first plurality of holes 130 is arranged within a circle having a first radius and the second plurality of holes 200 is arranged outside of the circle.

One or more annular seals may be provided to separate different portions of the second cavity. In some examples, the annular seals are nickel plated annular seals. For example, first and second annular seals 204 and 208, respectively, may be provided to define boundaries between a supply portion 210 of the second cavity 190, an exhaust portion 212 of the second cavity 190, and a gas curtain portion 214, respectively. Purge gas may be supplied by a gas source 215 and a valve 217 to the gas curtain portion 214.

In this example, the first annular seal 204 defines the boundary between the supply portion 210 and the exhaust portion 212. A third annular seal 220 (in conjunction with the second annular seal 208) may be provided to define the gas curtain portion 214 of the second cavity 190. In this example, the second annular seal 208 defines the boundary between the exhaust portion 212 and the gas curtain portion 214 of the second cavity 190. The first, second and third annular seals 204, 208, and 220, respectively, may include annular metal seals.

The radially outer section 180 further defines exhaust inlets 240 and exhaust cavities 242 that receive exhaust gas from the exhaust portion 212 of the second cavity 190. A valve 250 and a pump 252 may be used to evacuate the exhaust portion 212. The radially outer section 180 also defines a gas curtain cavity 260 and a gas curtail outlet 262 that supply purge gas to the gas curtain portion 214 of the second cavity 190. A gas source 270 and a valve 272 may be used to control purge gas supplied to the gas curtain portion 214.

The third annular seal 220 may also provide an electrical connection from the plasma generator 142 to the electrode 138 embedded in the faceplate 124, although other methods for connecting the electrode 138 may be used.

A controller 280 may be used to monitor system parameters using sensors and to control the gas delivery system 160, the plasma generator 142 and other components of the process.

Figure 3:
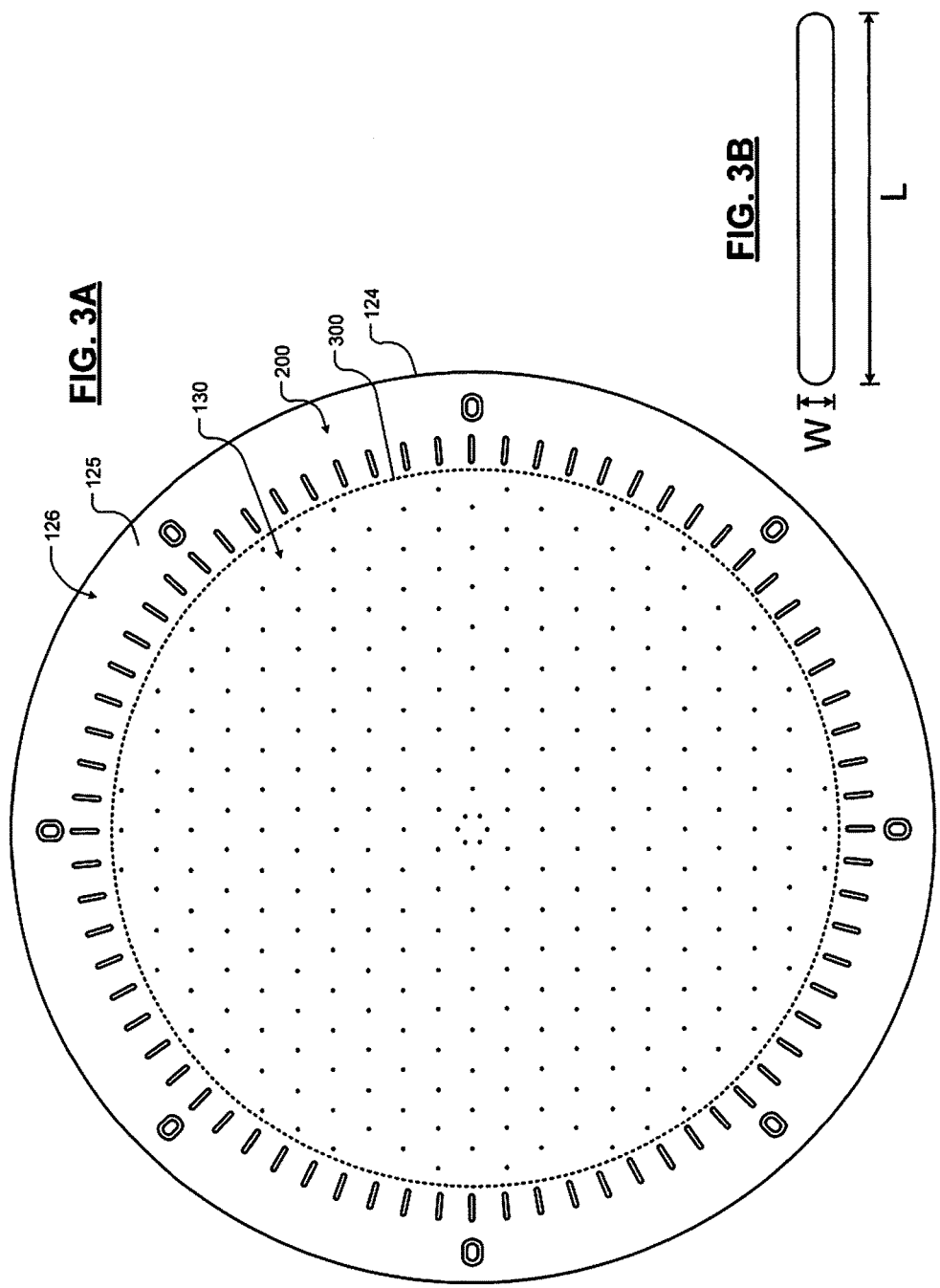
FIGS. 3A and 3B illustrate an example of a faceplate according to the present disclosure.

Referring now to FIGS. 3A and 3B, an example of the faceplate 124 is shown to include the first plurality of holes 130 arranged inside of a circle 300 having a first radius. The faceplate 124 further includes the second plurality of holes 200 arranged outside of the circle 300. As can be appreciated, at least some of the holes of the first or second plurality of holes 130, 200, respectively are slot-shaped as shown in FIG. 3B.

The slots have a first size dimension (width in the example) that is smaller than a second size dimension (length in the example). In some examples, the first size dimension of the slot is less than 2 or 3 plasma sheath thicknesses and the second size dimension of the slot is greater the second size dimension. In some examples, the second size dimension of the slot is at least 2-10 times greater the first size dimension depending upon a desired conduction for the faceplate. While all of the first plurality of holes 130 shown in FIG. 3A are circular and all of the second plurality of holes 200 in FIG. 3A are slot-shaped, the circular holes and the slot-shaped holes may be arranged both inside of and outside of the circle 300 as can be seen in the examples shown in FIGS. 4 and 5. While the faceplate 124 in the example includes the holes 130 that are used to deliver process gas and the holes 200 that are used to receive exhaust gas, the exhaust gas can be removed from the processing chamber independently from the faceplate 124.

Figure 4:
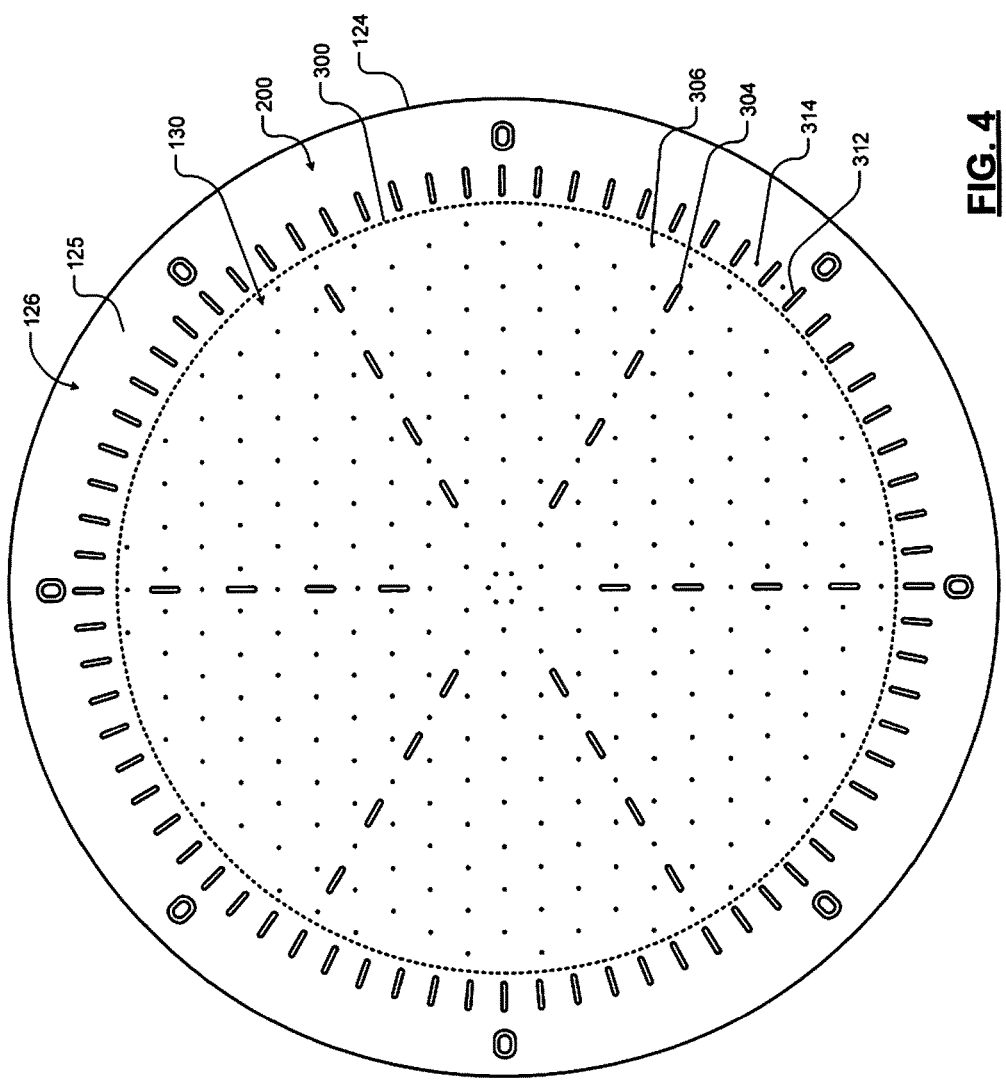
FIGS. 4-5 illustrates other examples of faceplates according to the present disclosure.
Figure 5:
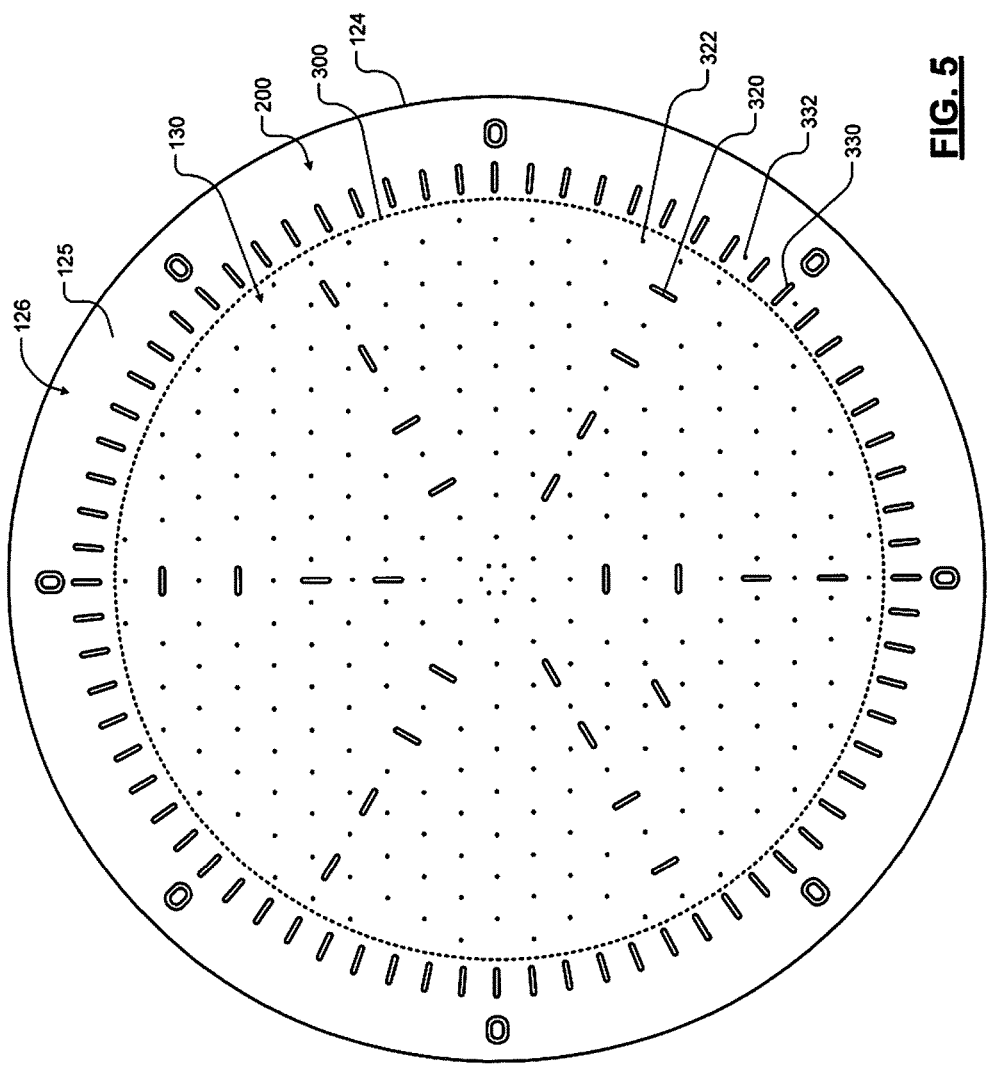

Referring now to FIGS. 4-5, still other arrangements of the holes in the faceplate are contemplated. In FIG. 4, the first plurality of holes 130 includes both slotted holes 304 and circular shaped holes 306. Likewise, the second plurality of holes 200 includes both slotted holes 312 and circular shaped holes 314. In some examples, the circular holes 306, 314 have a diameter than is less than 2 or 3 plasma sheath thicknesses to prevent HCD.

In FIG. 5, the first plurality of holes 130 includes both slotted holes 320 and circular shaped holes 322. Likewise, the second plurality of holes 200 includes both slotted holes 330 and circular shaped holes 332. At least some of the slotted holes 320, 330 are arranged transverse to the radial lines of the faceplate 124 or at other angles. In some examples, the circular holes 322, 332 have a diameter than is less than 2 or 3 plasma sheath thicknesses to prevent HCD.

Figure 6:
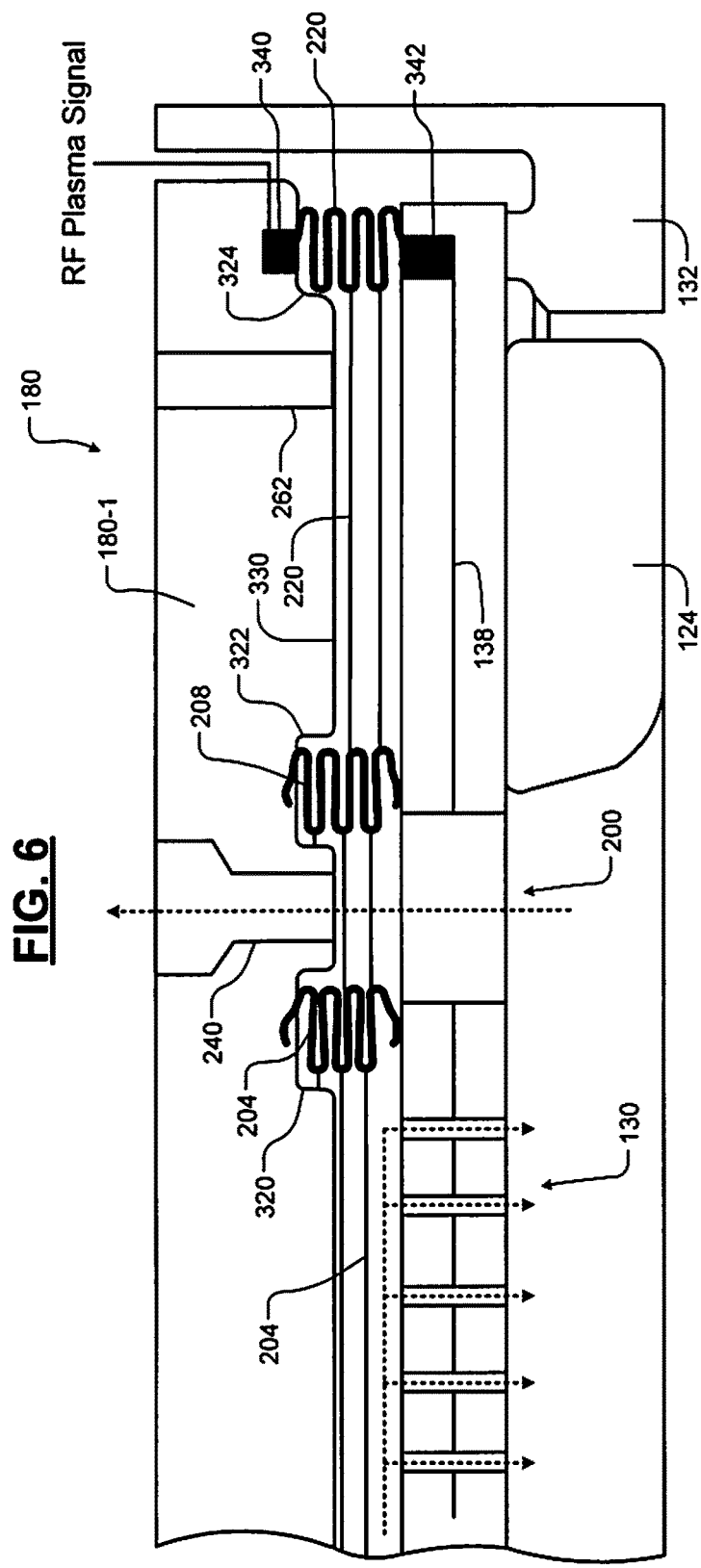
FIG. 6 illustrates a partial cross-sectional view of an example of the faceplate and the upper portion of the gas distribution device.

Referring now to FIG. 6, an enlarged view of a portion of the faceplate 124 and the radially outer section 180 is shown. The first, second and third annular seals 204, 208, and 220 may be arranged in corresponding grooves 320, 322, and 324, respectively, in a surface 330 of the radially outer section 180. The third annular seal 220 may be biased against metal contacts 340 and 342. The metal contact 340 is connected to the plasma generator. The metal contact 342 is in contact with the electrode 138.

Figure 7:
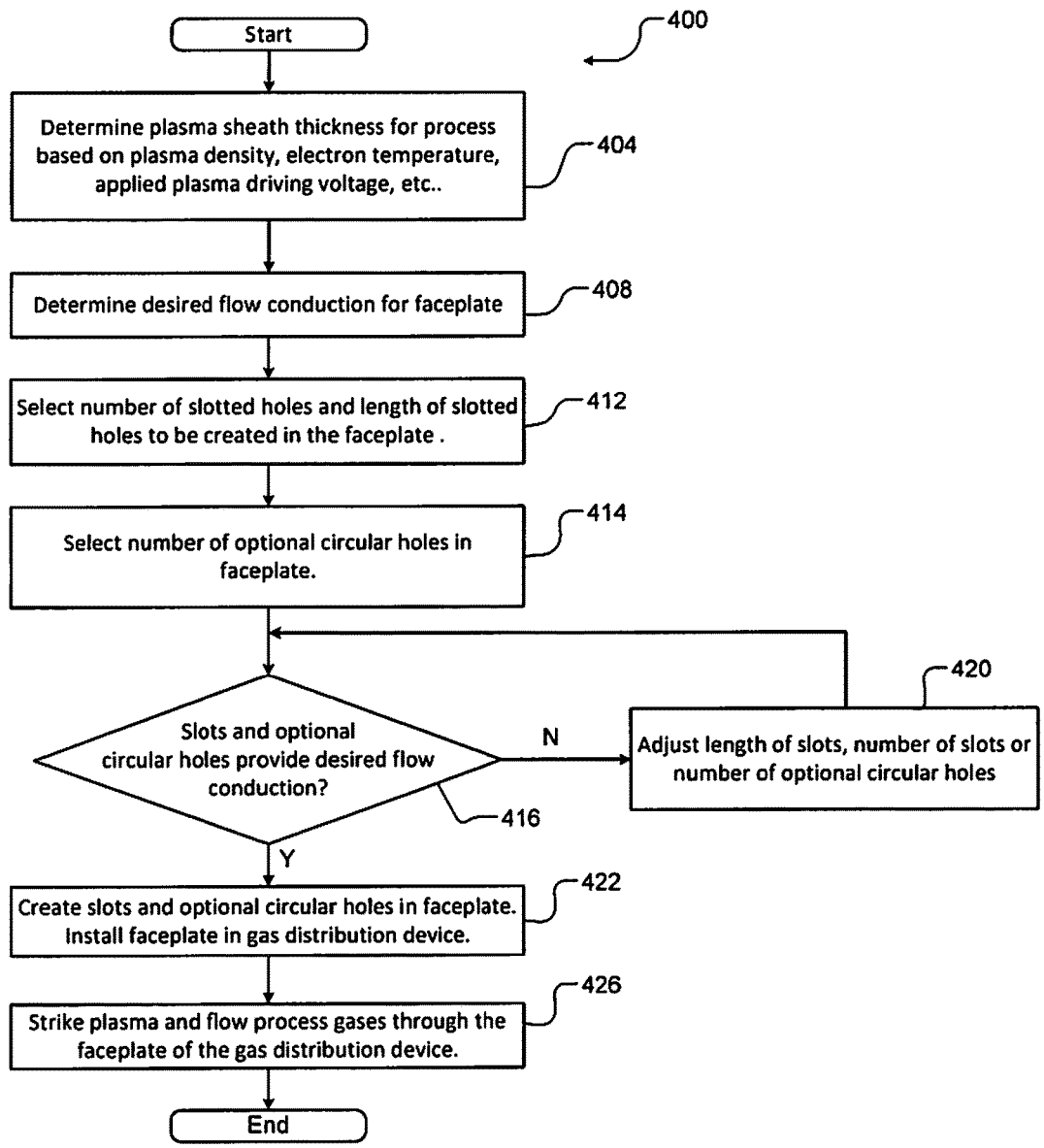
FIG. 7 illustrates an example of a method for reducing HCD in a faceplate during plasma processing according to the present disclosure.

Referring now to FIG. 7, an example of a method 400 for reducing HCD in a faceplate during plasma processing is shown. At 404, a plasma sheath thickness is determined for the plasma process. In some examples, the plasma sheath thickness can be determined based on plasma density, electron temperature, applied plasma driving voltage, etc. At 408, the desired flow conduction for the faceplate is selected for the process.

At 412, the number, width, and length of slotted holes in the faceplate is selected. The slots have a width that is less than 2 or 3 plasma sheath thicknesses to prevent HCD. The length is selected to be greater than 2-10 times the width and is selected to provide the desired flow conduction. At 414, the number of circular holes (optional) in the faceplate is selected. In some examples, the optional circular holes have a diameter that is less than 2 or 3 plasma sheath thicknesses. At 416, the flow conduction for the selected number of slots and optional circular holes is determined and compared to the desired flow conduction. If the desired flow conduction is not provided, the length of the slots, the number of slots or the number of optional circular holes is adjusted and the method returns to 416. If the desired flow conduction is provided, the faceplate is created with the slots and optional circular holes and installed in a gas distribution device of a processing chamber at 422. At 428, plasma is struck and process gases are supplied through the faceplate of the gas distribution device.

For example only, the controller 280 supplies a mixture of process gases and purge gas though the faceplate and evacuates exhaust gas. For example, the controller 280 supplies a first precursor through the faceplate of the gas distribution device during one phase of an ALD cycle. The controller 280 supplies purge gas to create the gas curtain at edges of the faceplate. The controller 280 removes exhaust gas through the faceplate, for example using the pump and valve. After exposure of the substrate to the first precursor, the controller 280 may perform a purge step to remove the first precursor.

Thereafter, the controller 280 supplies a second precursor through the faceplate of the gas distribution device during another phase of the ALD cycle. The controller 280 supplies purge gas to create the gas curtain at edges of the faceplate. The controller 280 removes exhaust gas through the faceplate, for example using the pump and valve. After exposure of the substrate to the second precursor, the controller 280 performs a purge step to remove the second precursor. The controller 280 may repeat the ALD cycle one or more times to build up a layer of film on the substrate.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term controller may be replaced with the term circuit. The term controller may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The controller may include one or more interface circuits. In some examples, the interface circuits may include wired or wireless interfaces that are connected to a local area network (LAN), the Internet, a wide area network (WAN), or combinations thereof. The functionality of any given controller of the present disclosure may be distributed among multiple controllers that are connected via interface circuits. For example, multiple controllers may allow load balancing. In a further example, a server (also known as remote, or cloud) controller may accomplish some functionality on behalf of a client controller.

The term code, as used above, may include software, firmware, and/or microcode, and may refer to programs, routines, functions, classes, data structures, and/or objects.

The term shared processor circuit encompasses a single processor circuit that executes some or all code from multiple controllers. The term group processor circuit encompasses a processor circuit that, in combination with additional processor circuits, executes some or all code from one or more controllers. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple controllers. The term group memory circuit encompasses a memory circuit that, in combination with additional memories, stores some or all code from one or more controllers.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium include nonvolatile memory circuits (such as a flash memory circuit or a mask read-only memory circuit), volatile memory circuits (such as a static random access memory circuit and a dynamic random access memory circuit), and secondary storage, such as magnetic storage (such as magnetic tape or hard disk drive) and optical storage.

The apparatuses and methods described in this application may be partially or fully implemented by a special purpose computer created by configuring a general purpose computer to execute one or more particular functions embodied in computer programs. The computer programs include processor-executable instructions that are stored on at least one non-transitory, tangible computer-readable medium. The computer programs may also include or rely on stored data. The computer programs may include a basic input/output system (BIOS) that interacts with hardware of the special purpose computer, device drivers that interact with particular devices of the special purpose computer, one or more operating systems, user applications, background services and applications, etc. The computer programs may include: (i) assembly code; (ii) object code generated from source code by a compiler; (iii) source code for execution by an interpreter; (iv) source code for compilation and execution by a just-in-time compiler, (v) descriptive text for parsing, such as HTML (hypertext markup language) or XML (extensible markup language), etc. As examples only, source code may be written in C, C++, C#, Objective-C, Haskell, Go, SQL, Lisp, Java®, ASP, Perl, Javascript®, HTML5, Ada, ASP (active server pages), Perl, Scala, Erlang, Ruby, Flash®, Visual Basic®, Lua, or Python®.

None of the elements recited in the claims is intended to be a means-plus-function element within the meaning of 35 U.S.C. § 112(f) unless an element is expressly recited using the phrase "means for", or in the case of a method claim using the phrases "operation for" or "step for".

What is claimed is:

1. A faceplate assembly for a gas distribution system of a plasma processing chamber, comprising:
    a faceplate body having a first surface, a second surface opposite to the first surface and a side surface;
    a first plurality of holes in the faceplate body that extend from the first surface to the second surface;
    a second plurality of holes in the faceplate body that extend from the first surface to the second surface, wherein
  the first plurality of holes have a first size dimension and a second size dimension in a plane parallel to the first surface,
  the first size dimension is transverse to the second size dimension,
  the first size dimension is less than 3 plasma sheath thicknesses of plasma generated by the plasma processing chamber,
  the second size dimension is greater than 2 times the first size dimension,
  the second plurality of holes exhaust a process gas subsequent to the process gas being exposed to a substrate; and
first, second and third annular metal seals arranged on the faceplate body to define a supply portion, an exhaust portion and a gas curtain portion of a cavity,
wherein
  the first plurality of holes are disposed in the supply portion,
  the supply portion is disposed radially inward of the first annular metal seal,
  the exhaust portion is disposed between the first annular metal seal and the second annular metal seal, and
  the second plurality of holes are disposed within the exhaust portion.

2. The faceplate assembly of claim 1, wherein the first size dimension is less than 2 plasma sheath thicknesses of plasma generated by the plasma processing chamber.

3. The faceplate assembly of claim 1, wherein the second size dimension is greater than 9 times the first size dimension.

4. The faceplate assembly of claim 1, wherein the second plurality of holes are arranged radially outside of the first plurality of holes.

5. The faceplate assembly of claim 4, wherein the second plurality of holes are circular-shaped and have a diameter that is less than 3 plasma sheath thicknesses of the plasma.

6. The faceplate assembly of claim 1, wherein the second plurality of holes have a diameter that is less than 3 plasma sheath thicknesses of the plasma.

7. A plasma processing system to process a substrate, the plasma processing system comprising:
  a processing chamber;
  a gas distribution device arranged in the processing chamber and including an upper portion, a faceplate and a first cavity between the upper portion and the faceplate, wherein the gas distribution device directs a process gas to the substrate;
  a substrate support arranged in the processing chamber to support the substrate;
  a plasma generator to generate plasma between the faceplate and the substrate support,
  wherein
    the faceplate includes
      a faceplate body having a first surface,
      a second surface opposite to the first surface,
      a side surface, and
      a first plurality of holes in the faceplate body that extend from the first surface to the second surface,
    the first plurality of holes are slot-shaped and have a first size dimension and a second size dimension in a plane parallel to the first surface,
    the first size dimension is transverse to the second size dimension,
    the first size dimension is less than 3 plasma sheath thicknesses of the plasma generated by the plasma generator,
    the second size dimension is greater than 2 times the first size dimension, and
    the first plurality of holes exhaust the process gas subsequent to the process gas being exposed to the substrate; and
  first, second and third annular metal seals arranged in the first cavity to define a supply portion, an exhaust portion and a gas curtain portion of the first cavity,
  wherein
    the faceplate comprises a second plurality of holes disposed in the supply portion,
    the supply portion is disposed radially inward of the first annular metal seal,
    the exhaust portion is disposed between the first annular metal seal and the second annular metal seal, and
    the first plurality of holes are disposed within the exhaust portion.

8. The plasma processing system of claim 7, wherein the first size dimension is less than 2 plasma sheath thicknesses of plasma generated by the processing chamber.

9. The plasma processing system of claim 7, wherein the second size dimension is greater than 9 times the first size dimension.

10. The plasma processing system of claim 7, wherein the second plurality of holes are arranged radially inside the first plurality of holes.

11. The plasma processing system of claim 10, wherein the second plurality of holes are slot-shaped and have the first size dimension and the second size dimension.

12. The plasma processing system of claim 10, wherein the second plurality of holes are circular-shaped and have a diameter that is less than 3 plasma sheath thicknesses of the plasma generated by the plasma generator.

13. The plasma processing system of claim 7, wherein the second plurality of holes are circular-shaped and have a diameter that is less than 3 plasma sheath thicknesses of the plasma generated by the plasma generator.

14. The plasma processing system of claim 7, wherein the process gas flows through a second cavity in the upper portion, through the faceplate and into the supply portion of the first cavity.

15. The plasma processing system of claim 7, wherein the substrate is exposed to the process gas and then the process gas flows back through the faceplate, the exhaust portion of the first cavity, and the upper portion.

16. The plasma processing system of claim 7, wherein a purge gas flows through the upper portion to the gas curtain portion of the first cavity and between the second annular metal seal and the third annular metal seal.

17. A method for reducing hollow cathode discharge in a faceplate of a gas distribution device used in a plasma process, the method comprising:
  determining a plasma sheath thickness for the plasma process;
  providing the faceplate including a faceplate body having a first surface, a second surface opposite to the first surface and a side surface;
  creating a first plurality of holes in the faceplate body that extend from the first surface to the second surface;
  creating a second plurality of holes in the faceplate body that extend from the first surface to the second surface,
  wherein the first plurality of holes have a first size dimension and a second size dimension in a plane parallel to the first surface, the first size dimension is transverse to the second size dimension, the first size dimension is less than 3 plasma sheath thicknesses of plasma generated by the plasma process, the second size dimension is greater than 2 times the first size dimension, and the second plurality of holes exhaust a process gas subsequent to the process gas being exposed to a substrate;

creating first, second and third annular metal seals arranged on the faceplate body to define a supply portion, an exhaust portion and a gas curtain portion of a cavity, wherein the first plurality of holes are disposed in the supply portion, the supply portion is disposed radially inward of the first annular metal seal, the exhaust portion is disposed between the first annular metal seal and the second annular metal seal, and the second plurality of holes are disposed within the exhaust portion;

arranging the faceplate adjacent to an upper portion of the gas distribution device of a plasma processing chamber;

striking plasma and, via the first plurality of holes, supplying process gases through the faceplate of the gas distribution device to expose the substrate to the process gases; and via the second plurality of holes, exhausting the process gases subsequent to the process gases being exposed to the substrate.

18. The method of claim 17, further comprising determining the plasma sheath thickness based on a plasma density, an electron temperature, and an applied plasma driving voltage.

19. The method of claim 17, wherein the second plurality of holes have the first size dimension and the second size dimension.

20. The method of claim 17, wherein the second plurality of holes are circular-shaped and have a diameter that is less than 3 plasma sheath thicknesses of the plasma.

21. The method of claim 17, wherein the faceplate comprises a third plurality of holes, which are circular-shaped and have a diameter that is less than 3 plasma sheath thicknesses of the plasma.

22. The faceplate assembly of claim 1, wherein the second plurality of holes are round-shaped holes.

23. The faceplate assembly of claim 1, wherein the second plurality of holes are slot-shaped holes.

24. The faceplate assembly of claim 1, wherein:
the first plurality of holes are disposed inside a circle; and
the second plurality of holes are disposed outside the circle.

25. The faceplate assembly of claim 1, further comprising a third plurality of holes disposed radially outward of the annular seal and being slot-shaped.

26. The faceplate assembly of claim 1, further comprising a third plurality of holes disposed radially inward of the annular seal and being round-shaped.

27. The faceplate assembly of claim 1, further comprising:
a third plurality of holes; and
a fourth plurality of holes,
wherein
the first plurality of holes are disposed radially inward of a circle and are slot-shaped,
the second plurality of holes are disposed radially outward of the circle,
the third plurality of holes are disposed radially inward of the circle and are round-shaped, and
the fourth plurality of holes are disposed radially outward of the circle and are slot-shaped.

28. The faceplate assembly of claim 27, wherein:
the first plurality of holes and the third plurality of holes direct the process gas to the substrate; and
the second plurality of holes and the fourth plurality of holes exhaust the process gas subsequent to the process gas being exposed to the substrate.

29. The faceplate assembly of claim 1, wherein:
the first size dimension is a width of each of the first plurality of holes; and
a diameter of each of the second plurality of holes is less than or equal to a width of each of the first plurality of holes.

30. The plasma processing system of claim 7, wherein:
the gas distribution device directs the process gas from a first area on a first side of the faceplate body, through the second plurality of holes and to the substrate;
the substrate is in a second area on a second side of the faceplate body opposite the first side; and
the process gas is exhausted back through the first plurality of holes from the second area to the first area.

31. The plasma processing system of claim 7, wherein:
the process gas is supplied through the second plurality of holes to the substrate; and
no hole in the faceplate, located radially inward of an outermost one of the second plurality of holes, exhausts the process gas.

* * * * *